(12) United States Patent
Imanishi et al.

(10) Patent No.: US 10,461,697 B2
(45) Date of Patent: Oct. 29, 2019

(54) OSCILLATION CIRCUIT AND OSCILLATION-CIRCUIT DRIVING METHOD

(71) Applicant: Murata Manufacturing Co., Ltd., Nagaokakyo-shi, Kyoto-fu (JP)

(72) Inventors: Toshio Imanishi, Nagaokakyo (JP); Hitoshi Matsuno, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 314 days.

(21) Appl. No.: 15/443,377

(22) Filed: Feb. 27, 2017

(65) Prior Publication Data

US 2017/0170786 A1 Jun. 15, 2017

Related U.S. Application Data

(63) Continuation of application No. PCT/JP2015/067911, filed on Jun. 22, 2015.

(30) Foreign Application Priority Data

Aug. 29, 2014 (JP) .................................. 2014-175172

(51) Int. Cl.
*H03B 5/36* (2006.01)
*B06B 1/06* (2006.01)
(Continued)

(52) U.S. Cl.
CPC ............. *H03B 5/36* (2013.01); *B06B 1/0253* (2013.01); *B06B 1/06* (2013.01); *H03B 5/26* (2013.01);
(Continued)

(58) Field of Classification Search
CPC ... H03B 5/36; H03B 5/32; H03B 5/30; H03B 2200/0094; H03L 7/099; H03L 7/085;
(Continued)

(56) References Cited

U.S. PATENT DOCUMENTS 3,885,902 A 5/1975 Fujieda et al.
6,140,858 A 10/2000 Dumont
(Continued)

FOREIGN PATENT DOCUMENTS

JP S6120405 A 1/1966
JP S49-348226 A 3/1974
(Continued)

OTHER PUBLICATIONS

Japanese Office Action issued for JP 2016-546017, dated May 29, 2018.
(Continued)

*Primary Examiner* — Arnold M Kinkead
(74) *Attorney, Agent, or Firm* — Arent Fox LLP

(57) ABSTRACT

An oscillation circuits that provides stable oscillations even when the amount of phase rotation of a piezoelectric resonator is small or fluctuates. The oscillation circuit includes a first amplifier having an input and an output, and a piezoelectric resonator connected between the input and the output of the first amplifier. Moreover, the oscillation circuit feeds, back to the input, a current flowing from the output of the first amplifier to the piezoelectric resonator. The oscillation circuit further includes an alternating-voltage waveform shaping circuit that applies, to the piezoelectric resonator, an alternating-voltage waveform having rising portions sharper than those of a sine wave.

17 Claims, 11 Drawing Sheets

(51) Int. Cl.
  *H03B 5/26* (2006.01)
  *H03L 1/02* (2006.01)
  *B60B 1/02* (2006.01)
  *B06B 1/02* (2006.01)

(52) U.S. Cl.
  CPC ............ *H03B 5/364* (2013.01); *H03L 1/028* (2013.01); *B06B 2201/55* (2013.01); *H03B 2200/0008* (2013.01)

(58) Field of Classification Search
  CPC ... H03L 7/095; H03L 7/24; H03L 1/00; H03L 1/022; H03L 1/026; H03L 3/00
  USPC .................................. 331/158, 116 FE, 176
  See application file for complete search history.

(56) References Cited

U.S. PATENT DOCUMENTS

| | | | |
|---|---|---|---|
| 6,429,571 B2* | 8/2002 | Raffalt | ................ G01F 23/2966 310/316.01 |
| 8,513,858 B2 | 8/2013 | Kagayama et al. | |
| 2006/0049884 A1 | 3/2006 | Kollmann | |
| 2008/0136542 A1 | 6/2008 | Hirama | |
| 2011/0095649 A1 | 4/2011 | Kagayama et al. | |

FOREIGN PATENT DOCUMENTS

| | | |
|---|---|---|
| JP | S5558604 A | 5/1980 |
| JP | S55127437 A | 10/1980 |
| JP | S57148472 A | 9/1982 |
| JP | S5956990 A | 4/1984 |
| JP | S59056990 U | 4/1984 |
| JP | S6242334 A | 2/1987 |
| JP | S62119008 A | 5/1987 |
| JP | H02101805 A | 4/1990 |
| JP | H11-508433 A | 7/1999 |
| JP | 2001313529 A1 | 11/2001 |
| JP | 2003224424 A | 8/2003 |
| JP | 2006510254 A | 3/2006 |
| JP | 2012023756 A | 2/2012 |
| JP | 2013146004 A | 7/2013 |
| WO | WO 2009141970 A1 | 11/2009 |

OTHER PUBLICATIONS

International Search Report issued for PCT/JP2015/067911 dated Sep. 15, 2015.
Written Opinion of the International Searching Authority issued for PCT/JP2015/067911 dated Sep. 15, 2015.

* cited by examiner

OSCILLATION CIRCUIT AND OSCILLATION-CIRCUIT DRIVING METHOD

CROSS REFERENCE TO RELATED APPLICATIONS

The present application is a continuation of PCT/JP2015/067911 filed Jun. 22, 2015, which claims priority to Japanese Patent Application No. 2014-175172, filed Aug. 29, 2014, the entire contents of each of which are incorporated herein by reference.

TECHNICAL FIELD

The present disclosure relates to an oscillation circuit having a piezoelectric resonator and an amplifier, and a driving method therefor.

BACKGROUND

Recently, vibration sources have been mounted as means for notification of incoming calls and the like in cellular phones and wearable terminals. For example, a vibration device described in Patent Document 1 (identified below) described below or the like may be used as such a vibration source. The vibration device described in Patent Document 1 is a piezoelectric resonator. In order to acquire stronger vibrations, Patent Document 1 discloses a piezoelectric resonator in which a weight is fixed at an end of a U-shaped elasticity plate provided with a piezoelectric element and that uses resonance of a vibration system including the weight.

Patent Document 1: WO2009/141970A1.

In order to cause the casing of a cellular phone or a wearable terminal to vibrate and cause a person to sense the vibration, the frequency of the vibration should preferably be about 100 to 300 Hz. Thus, an attempt to fix the weight at a tip of the elasticity plate as described above or to lower the spring properties of the elasticity plate has been made.

However, the resonance frequencies of piezoelectric resonators as described above may be varied due to variations due to the individual differences. In addition, piezoelectric resonators that vibrate at low frequencies as described above have a lower Q regarding resonance than clock devices using the same piezoelectric effect. Thus, when an oscillation circuit including such a piezoelectric resonator is configured, oscillation conditions may not be met. In addition, it has been difficult to assuredly cause an oscillation at and near the resonance frequency.

SUMMARY OF THE INVENTION

It is a purpose of the present disclosure to provide an oscillation circuit that enables a stable oscillation near the mechanical resonance frequency of the piezoelectric resonator, and a driving method therefor, even when a piezoelectric resonator is used having a small amount of phase rotation due to a low Q regarding resonance.

According to the present disclosure, there is provided an oscillation circuit having a first amplifier having an input end and an output end, and a piezoelectric resonator connected between the input end and the output end of the first amplifier. Moreover, the oscillation circuit is configured to feed back to the input end, a current flowing from the output end of the first amplifier to the piezoelectric resonator. The oscillation circuit further includes an alternating-voltage waveform shaping circuit that applies, to the piezoelectric resonator, an alternating-voltage waveform having rising portions sharper than those of a sine wave.

According to a certain specific aspect of the oscillation circuit, the alternating-voltage waveform shaping circuit is a second amplifier for excitation that outputs a substantially square wave to the piezoelectric resonator. In this case, a substantially square wave having rising portions sharper than those of a sine wave is applied to the piezoelectric resonator. A more stable oscillation can thus be obtained.

According to another specific aspect of the oscillation circuit, the oscillation circuit further includes a filter that attenuates a damped-capacitance current flowing in a damped capacitance in an equivalent circuit of the piezoelectric resonator and that allows a resonance current to pass therethrough. In this case, the current flowing in the damped capacitance can be attenuated, and the resonance current can be amplified by the first amplifier. Thus, even regarding a piezoelectric resonator having a small amount of phase rotation due to a low Q regarding resonance or the amount of phase rotation fluctuates, more stable oscillations can be obtained.

According to another specific aspect of the oscillation circuit, the oscillation circuit further includes an amplifier for differential driving, the amplifier being connected to the piezoelectric resonator and used to differentially drive the piezoelectric resonator together with the second amplifier for the excitation.

According to another specific aspect of the oscillation circuit, a series resistor is provided in series with the piezoelectric resonator, and the current flowing in the piezoelectric resonator is converted into a voltage through a voltage drop across the series resistor.

According to another specific aspect of the oscillation circuit, the first amplifier includes an operational amplifier having first and second input ends and an output end, and the filter is connected between the first or second input end and the output end.

According to another specific aspect of the oscillation circuit, the filter has an electrostatic capacity and resistors configured as a T-shaped circuit. In this case, the value of the electrostatic capacity can be reduced, thereby helping downsizing when an integrated circuit is formed.

According to another specific aspect of the oscillation circuit, the series resistor is a temperature compensation resistor with a resistance that changes with temperature.

According to another specific aspect of the oscillation circuit, the filter is a filter whose cutoff frequency changes with temperature and has a temperature compensation function.

According to another specific aspect of the oscillation circuit, an input-voltage threshold used at a time when an input signal rises differs from that used at a time when the input signal falls in the second amplifier.

According to another specific aspect of the oscillation circuit, an input signal range of the first amplifier is a range wider than or equal to an output amplitude range of the second amplifier.

According to another specific aspect of the oscillation circuit, an amplifier doubles as the first amplifier and the second amplifier. In this case, the number of components can be reduced, and a circuit configuration can be simplified.

According to another specific aspect of the oscillation circuit, the oscillation circuit is a differential-amplification-type oscillation circuit obtained by applying a Wien bridge oscillation circuit and has, as the amplifier, a differential amplifier having first and second input ends and an output end. In this aspect, the first input end and the output end as well as the second input end and the output end are electrically connected. Moreover, the piezoelectric resonator is provided in a first feedback circuit portion that connects the first input end and the output end.

The oscillation circuit may be a simple-feedback-type oscillation circuit such as a Colpitts oscillation circuit as long as the simple-feedback-type oscillation circuit is a current-feedback-type circuit.

According to another specific aspect of the oscillation circuit, the alternating-voltage waveform is a substantially square wave.

An oscillation-circuit driving method is provided for an oscillation circuit configured in accordance with the present disclosure, and includes feeding back a current and applying, to the piezoelectric resonator, an alternating-voltage waveform having rising portions sharper than those of a sine wave.

According to an oscillation circuit and a driving method described herein, even when piezoelectric resonators are used that have small amounts of phase rotation or the amounts of phase rotation tend to be varied in accordance with frequencies, stable oscillations can be obtained.

DETAILED DESCRIPTION OF THE EXEMPLARY EMBODIMENTS

In the following, the present disclosure will be clarified by describing specific embodiments with reference to the drawings.

It is noted that the embodiments described herein are examples, and it is pointed out that configurational portions may be partially replaced or combined with each other between different embodiments.

With regard to resonant vibration devices using piezoelectric vibrators (hereinafter referred to as piezoelectric resonators), variations in resonance frequency exist due to the individual differences. In addition, the resonance frequency may fluctuate in accordance with temperature characteristics or a change in the entire vibration system including a housing, in which the resonant vibration device is mounted, an example of which is a housing installation state, for example, where a cellular phone or a wearable terminal is lifted by hand or placed onto a desk and so on. Preferably, the driving is performed by an oscillation circuit that oscillates near the resonance frequency in order to constantly obtain high vibration performance using a piezoelectric vibrator of this type. However, piezoelectric resonators of this type are relatively largely varied in the amount of phase rotation, and the amounts of rotation themselves are small. Furthermore, the amount of phase rotation changes in accordance with temperature characteristics or a change in the entire vibration system including a housing and so on an example of which is a housing installation state. Thus, there are cases where it is difficult to cause a piezoelectric vibrator to assuredly oscillate in a conventional oscillation circuit. The oscillation circuits disclosed herein advantageously overcome these problems.

Figure 1:
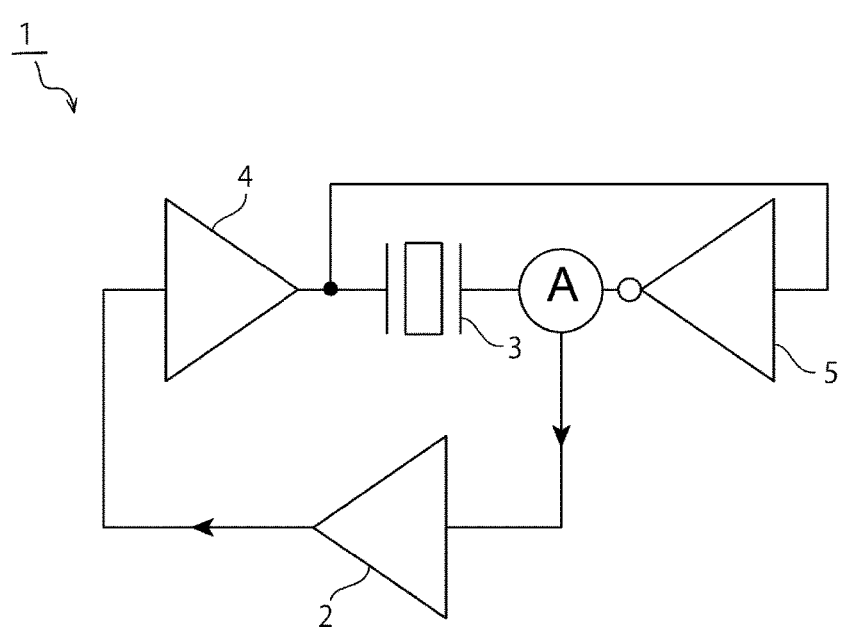
FIG. 1 is a circuit diagram of an oscillation circuit according to a first embodiment.
Figure 2:
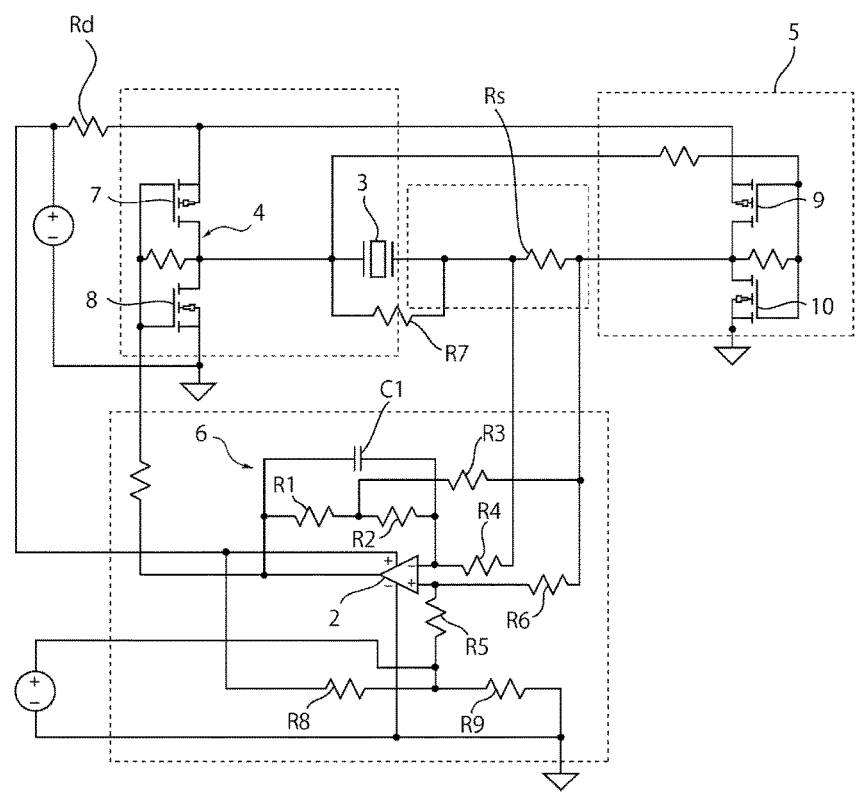
FIG. 2 is a circuit diagram illustrating a specific circuit example of the oscillation circuit according to the first embodiment.

FIG. 1 is a circuit diagram of an oscillation circuit according to a first embodiment, and FIG. 2 is a circuit diagram illustrating a specific circuit example of the oscillation circuit.

An oscillation circuit 1 has a first amplifier 2 serving as a current amplifier. The first amplifier 2 includes an operational amplifier. A low pass filter, which will be described later, is connected to this first amplifier 2 in the present embodiment.

A piezoelectric resonator 3 using a piezoelectric ceramic is connected between an input end and an output end of the first amplifier 2. The piezoelectric resonator 3 uses a primary resonance as described later. Note that the piezoelectric resonator 3 may use not only the primary resonance but also a secondary resonance, a tertiary resonance, or the like. The piezoelectric resonator 3 using a piezoelectric ceramic has a small amount of phase rotation, and the amount of phase rotation or the resonance frequency thereof and those of other piezoelectric resonators 3 using the piezoelectric ceramic are greatly varied due to the individual differences. In addition, the resonance frequency or the amount of phase rotation tends to fluctuate depending on an installation status.

A second amplifier 4 for excitation is connected between the output end of the first amplifier 2 and the input side of the piezoelectric resonator 3. An inverting amplifier 5 is connected between an input end and an output end of the piezoelectric resonator 3 for performing differential driving in the present embodiment.

The second amplifier 4 and the inverting amplifier 5 output a substantially square wave for driving the piezoelectric resonator 3. The second amplifier 4 and the inverting amplifier 5 can therefore form an alternating-voltage waveform shaping circuit in the exemplary embodiment. It is also noted that the term "substantially square wave" includes not only a square wave but also a wave having rising portions and falling portions that slightly lose amplitude and shape compared with a square wave. Even when the rising portions and falling portions of the substantially square wave lose amplitude and shape compared with a square wave, the rising portions and falling portions are sharper than those of the sine wave. The second amplifier 4 and the inverting amplifier 5 for differential driving are used to apply the substantially square wave to the piezoelectric resonator 3, that is, a waveform having rising portions sharper than those of a sine wave. In addition, since the inverting amplifier 5 for differential driving is used in the oscillation circuit 1, the amplitude of a voltage to be applied to the piezoelectric resonator 3 can be doubled. Thus, the vibration performance of the piezoelectric resonator 3 can further be improved. Note that a combination of a non-inverting amplifier and an inverting circuit connected to the input side or output side of the non-inverting amplifier may also be used instead of the inverting amplifier 5.

FIG. 2 illustrates a specific circuit configuration of the oscillation circuit of FIG. 1. As illustrated in FIG. 2, the first amplifier 2 has first and second input ends and an output end in the present embodiment. A low pass filter 6 is connected between the first input end and the output end. The low pass filter 6 has a capacitor C1 and resistors R1 to R3. The resistor R1 and the resistor R2 are connected in series, and are connected in parallel with the capacitor C1. The resistor R3 is connected between a reference potential and a connecting point between the resistor R1 and the resistor R2. A T-shaped circuit is thus formed by the resistors R1 to R3. In this case, the capacitance of the capacitor C1 can be reduced. The low pass filter can thus be downsized. It should be appreciated that the low pass filter is not limited to a combination of a capacitor and resistors. For example, inductors may be used instead of the resistors, or an active filter may be used. The piezoelectric resonator 3 may be regarded as an electrostatic capacity, and may be caused to have a function as a filter by connecting a C, an L, and so on in series or parallel with the piezoelectric resonator 3.

The low pass filter 6 is configured to attenuate a damped-capacitance current $I_{C0}$ of the piezoelectric resonator 3 to be described later, and to allow a primary resonance current $I_{1st}$ to pass therethrough. Note that the primary resonance of the piezoelectric resonator 3 is used in the present embodiment; however, a secondary resonance or a tertiary resonance may also be used. In that case, it is sufficient that, as a pass filter, a filter be used that blocks a primary resonance current and that allows a secondary resonance current or a tertiary resonance current to pass therethrough. Thus, the filter that allows a resonance current to pass therethrough is not limited to a low pass filter, and may also be a high pass filter or a band pass filter.

The primary resonance current $I_{1st}$ is thus applied to the second amplifier 4 from the output end of the first amplifier 2. Much of the damped-capacitance current $I_{C0}$ is not applied to the second amplifier 4. The second amplifier 4 is not particularly limited but has a circuit configuration in which FETs 7 and 8 are connected in a complementary manner in the present embodiment.

It is noted that a function for limiting a current value may be added to an amplifier that applies a voltage to a piezoelectric resonator, so that a flow-through current does not take a large value at the time of switching. Components that provide the current limitation function may be a resistor or an inductance connected in series with an amplification circuit in a path through which a flow-through current flows between a power source and GND. Alternatively, current limitation may be performed using a constant current source or the like. In addition, alternative designs other than these may also be used as would be appreciated to one skilled in the art.

The second amplifier 4 outputs the above-described substantially square wave. An output end of this second amplifier 4 is connected to the piezoelectric resonator 3. The output end of the piezoelectric resonator 3 is connected to the first input end of the first amplifier 2 with a resistor R4 interposed therebetween. In addition, the output end of the piezoelectric resonator 3 is connected to the second input end of the first amplifier 2 with resistors Rs and R6 interposed therebetween.

As shown, a resistor R7 is connected to the piezoelectric resonator 3. This resistor R7 is provided so as to protect other circuit portions from the piezoelectric resonator 3. An undesired electromotive force may occur in the piezoelectric resonator 3. In order to protect the circuit from this electromotive force, the resistor R7 is connected in parallel with the piezoelectric resonator 3. However, the protection circuit is not necessarily limited to this configuration and, for example, resistors may be inserted between GND and both ends of the piezoelectric resonator 3. Diodes such as Zener diodes may also be inserted instead of these resistors. When no voltage is applied to a piezoelectric resonator and the resonator is stopped, other designs may also be used that for example connects the potentials of input and output ends of the piezoelectric resonator to the same potential.

Note that, similarly to the second amplifier 4, the inverting amplifier 5 for differential amplification is configured by connecting two FETs 9 and 10 in a complementary manner.

Moreover, the configuration of the second amplifier 4 and that of the inverting amplifier 5 are not particularly limited to the specific design as shown.

A resistor R8 and a resistor R9 are connected in series. A connecting point between the resistor R8 and the resistor R9 is connected to the second input end of the first amplifier 2 with a resistor R5 interposed therebetween. These resistors R8 and R9 apply a reference potential through resistance division. Note that a reference-potential generation method is not limited to this, and for example an LDO, a voltage follower circuit, or the like may also be used.

The second amplifier 4 and the inverting amplifier 5 apply a substantially square wave voltage to the piezoelectric resonator 3 as described above in the oscillation circuit 1. In addition, the low pass filter 6 connected to the first amplifier 2 attenuates the damped-capacitance current $I_{C0}$, which will be described below. A stable oscillation can thus be obtained even when the piezoelectric resonator 3 has a small amount of phase rotation, the case where the amount of phase rotation of the piezoelectric resonator 3 and those of other piezoelectric resonators 3 are varied due to the individual differences, and furthermore the case where the resonance frequency or the amount of phase rotation fluctuates in accordance with an installation status of a device equipped with the oscillation circuit 1. This will be described with reference to FIGS. 3 to 6.

Figure 3:
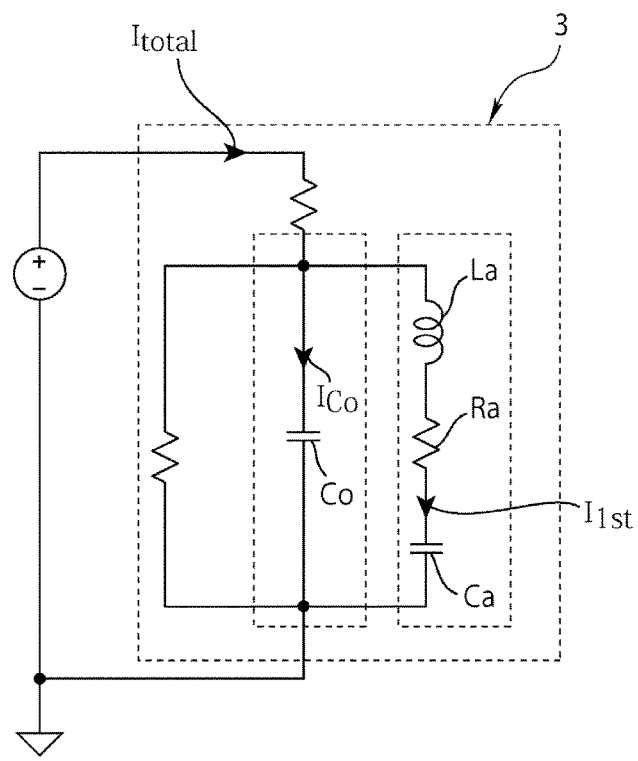
FIG. 3 is a diagram for describing an equivalent circuit including a series resonance of a piezoelectric resonator using a piezoelectric ceramic.

FIG. 3 is a diagram illustrating an equivalent circuit of the piezoelectric resonator 3. In the piezoelectric resonator 3, a series resonance circuit portion is connected in parallel with a damped capacitance Co. Again, it is noted that although higher-order resonances such as secondary and tertiary resonances occur in addition to a primary resonance, a description will be made by omitting a description regarding the higher resonances. An inductance La, a resistor Ra, and a capacitance Ca are connected in series in a primary series resonance circuit portion.

A piezoelectric resonator has a small Q and a small amount of phase rotation. In this case, the damped-capacitance current $I_{co}$ is dominant and the primary resonance current $I_{1st}$ tends to be buried in the damped-capacitance current $I_{co}$ in the current flowing in a piezoelectric resonator, and thus the resonance characteristics of the resonator tend not to appear in the frequency characteristics of the impedance. Thus, the resonance frequency is shifted from an impedance minimum value, and the impedance minimum value and the resonance frequency often do not match. In addition, it is difficult to cause a stable oscillation at the resonance frequency in a general oscillation circuit.

Figure 4:
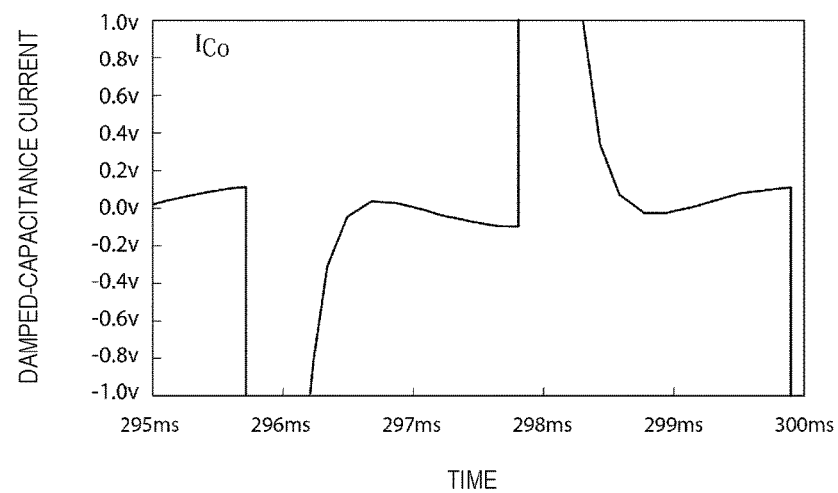
FIG. 4 is a diagram illustrating a current waveform of a damped-capacitance current $I_{C0}$.
Figure 5:
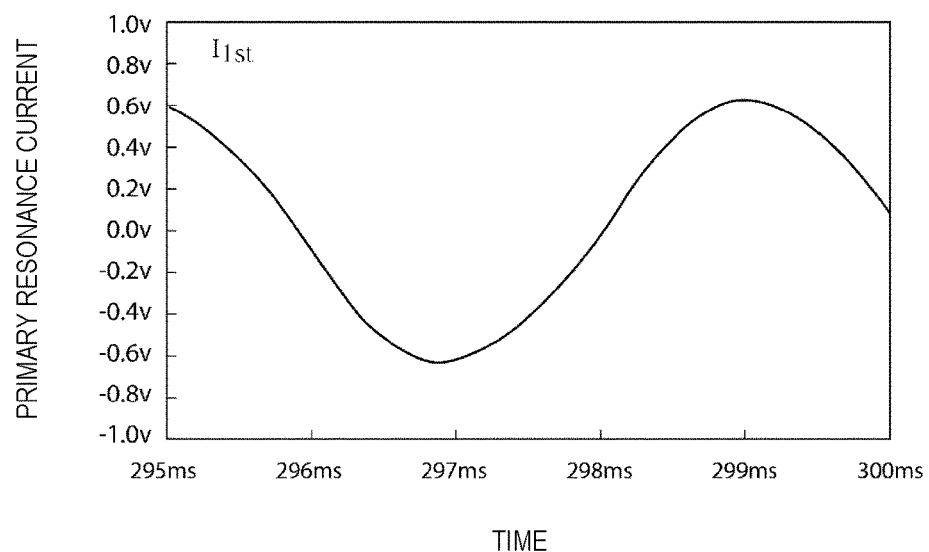
FIG. 5 is a diagram illustrating a current waveform of a primary resonance current $I_{1st}$.
Figure 6:
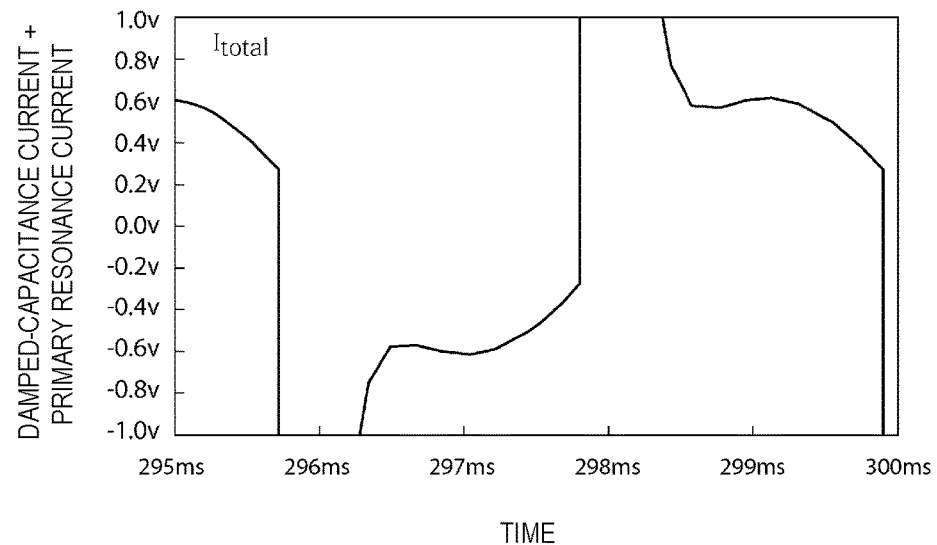
FIG. 6 is a diagram illustrating a current waveform of $I_{total}$ flowing in the equivalent circuit illustrated in FIG. 3.

The meaning of extraction of the primary resonance current $I_{1st}$ and elimination of the damped-capacitance current $I_{CO}$ will be described with reference to FIGS. 4 to 6. FIGS. 4 to 6 are diagrams illustrating current waveforms at respective positions when the substantially square wave is applied to the equivalent circuit of the piezoelectric resonator 3. FIG. 4 is a diagram illustrating a current waveform of the damped-capacitance current $I_{CO}$, FIG. 5 is a diagram illustrating a current waveform of the primary resonance current $I_{1st}$, and FIG. 6 is a diagram illustrating a current waveform of a current $I_{total}$ of FIG. 3. This current $I_{total}$ is the sum of the primary resonance current $I_{1st}$ and the damped-capacitance current $I_{CO}$. Note that the vertical axis is magnified for the waveform of the damped-capacitance current $I_{co}$, and display is performed by eliminating maximum amplitude portions of the waveform. The phase difference between the primary resonance current $I_{1st}$ and an applied voltage becomes zero at the resonance frequency.

The second amplifier 4 and the inverting amplifier 5 apply a substantially square-wave driving voltage to the piezoelectric resonator 3. A substantially square wave has an alternating-voltage waveform having rising portions sharper than those of a sine wave. As a result, in the oscillation circuit 1, charging for the damped capacitance Co is first performed through the substantially square-wave driving, and only the primary resonance current $I_{1st}$ flows after charging is completed for the damped capacitance Co. The damped-capacitance current $I_{CO}$ and the primary resonance current $I_{1st}$ can thus be temporally isolated from each other. A waveform in which the damped-capacitance current $I_{CO}$ and the primary resonance current $I_{1st}$ are temporally isolated from each other is thus applied to the input end of the first amplifier 2 in FIG. 1.

As clearly shown in FIG. 4, the damped-capacitance current $I_{CO}$ appears as a spike-like shape only when the voltage rises and when the voltage falls.

On the other hand, the primary resonance current $I_{1st}$ has a substantially sine-wave shape. At frequencies other than the resonance frequency, the impedance of the series resonance circuit becomes higher than that acquired at the resonance frequency, and thus the amplitude is not relatively large. In addition, the amount of phase rotation does not become zero.

When measured, an actual current waveform of the piezoelectric resonator becomes similar to that of $I_{total}$ as illustrated in FIG. 6. That is, the actual current waveform is a waveform obtained by superimposing the primary resonance current $I_{1st}$ on the damped-capacitance current $I_{CO}$.

On the other hand, as is clear from FIGS. 4 and 5, the charging time for the damped capacitance using the damped-capacitance current $I_{CO}$ is shorter than the period of the primary resonance current $I_{1st}$. The primary resonance current $I_{1st}$ can thus be extracted by using the low pass filter 6 that blocks the damped-capacitance current $I_{CO}$ and that allows the primary resonance current $I_{1st}$ to pass therethrough. As a result, only the primary resonance current $I_{1st}$ can be extracted using the low pass filter 6 and can be applied to the second amplifier 4 and the inverting amplifier 5 in the oscillation circuit 1.

Note that, desirably, the sum of the amount of phase rotation of the first amplifier 2 and the amount of phase rotation of the second amplifier 4 is 360°×n (n: integers including 0). As long as this condition is met, the amount of phase rotation of the first amplifier 2 and the amount of phase rotation of the second amplifier 4 are not particularly limited.

Figure 7:
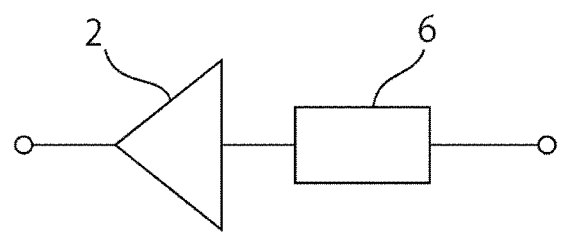
FIG. 7 is a schematic circuit diagram illustrating a circuit in which a low pass filter is connected in series with a current amplifier.

In addition, the low pass filter 6 is integrated into the first amplifier 2 in the present embodiment; however, the low pass filter 6 may also be connected in series with the first amplifier 2 as illustrated in FIG. 7. Furthermore, the position of the low pass filter and that of the first amplifier 2 may also be switched.

A series resistor Rs of FIG. 2 is inserted in a current measurement unit A in FIG. 1, and the current measurement unit A performs measurement through, in actuality, conversion into a voltage. The current flowing in the piezoelectric resonator is converted into a voltage through a voltage drop across this series resistor Rs. Instead of this, the current may also be extracted using a current mirror. Furthermore, the current waveform may also be extracted using a transformer instead of the series resistor Rs.

In the present embodiment, the potential difference across the both ends of the series resistor Rs is read in a state in which the inputs of the first amplifier 2 are connected to the outputs of the second amplifier 4 and inverting amplifier 5. Thus, an input to the first amplifier 2 significantly changes to a reference potential VDD or to near the ground potential GND every time switching is performed at the second amplifier 4 and the inverting amplifier 5. Thus, when an input range of the first amplifier 2 is narrower than an output range of the second amplifier 4 and inverting amplifier 5, it may not be able to actually read the potential difference across the both ends of the series resistor Rs. Accordingly, it is preferable that the input range of the first amplifier 2 be wider than the output range of the second amplifier 4 and inverting amplifier 5.

In contrast, when the input range of the first amplifier 2 is relatively narrow, it is desirable that a voltage amplitude range of the both ends of the series resistor Rs be narrow.

Preferably, the series resistor Rs is a temperature compensation resistor whose resistance changes with temperature. An NTC thermistor, a polysilicon resistor, or the like can be implemented as such a resistor. Using characteristics with which the resistance changes with temperature, temperature compensation can be performed such that a shift of the driving frequency of the piezoelectric resonator from the mechanical resonance frequency is reduced. As a result, a more stable oscillation state can be obtained.

Moreover, a filter having a temperature compensation function through which filter characteristics change with temperature is preferably used for the low pass filter 6 and also for a high pass filter or a band pass filter as an alternative to the low pass filter 6. For example, regarding the low pass filter or high pass filter, a low pass filter or high pass filter whose cutoff frequency changes with temperature is preferably used.

Furthermore, preferably, it is desirable that an input-voltage threshold used at the time when an input signal rises differ from that used at the time when the input signal falls in the second amplifier 4. The amplitude of a current is small at the time when the oscillation starts, and becomes gradually larger in a circuit using a piezoelectric resonator. The amplitude of a feedback signal is thus small at the time when an oscillation starts, and it may not be able to assuredly cause the second amplifier 4 to perform switching. For this, it is possible to ensure the second amplifier 4 performs switching even with a feedback signal having a small amplitude by lowering the threshold used at the time of rising and by setting the threshold used at the time of falling on the high side in the second amplifier 4. It is thus preferable that the input-voltage threshold used at the time when the input signal rises differ from that used at the time when the input signal falls, and more preferably, it is desirable that the input-voltage threshold be relatively low at the time of rising.

It is noted that the method for changing thresholds for the input signal in the second amplifier 4 is not particularly limited. For example, the thresholds can be changed by adjusting the value of a resistor Rd connected to the second amplifier 4 in FIG. 2.

Figure 8:
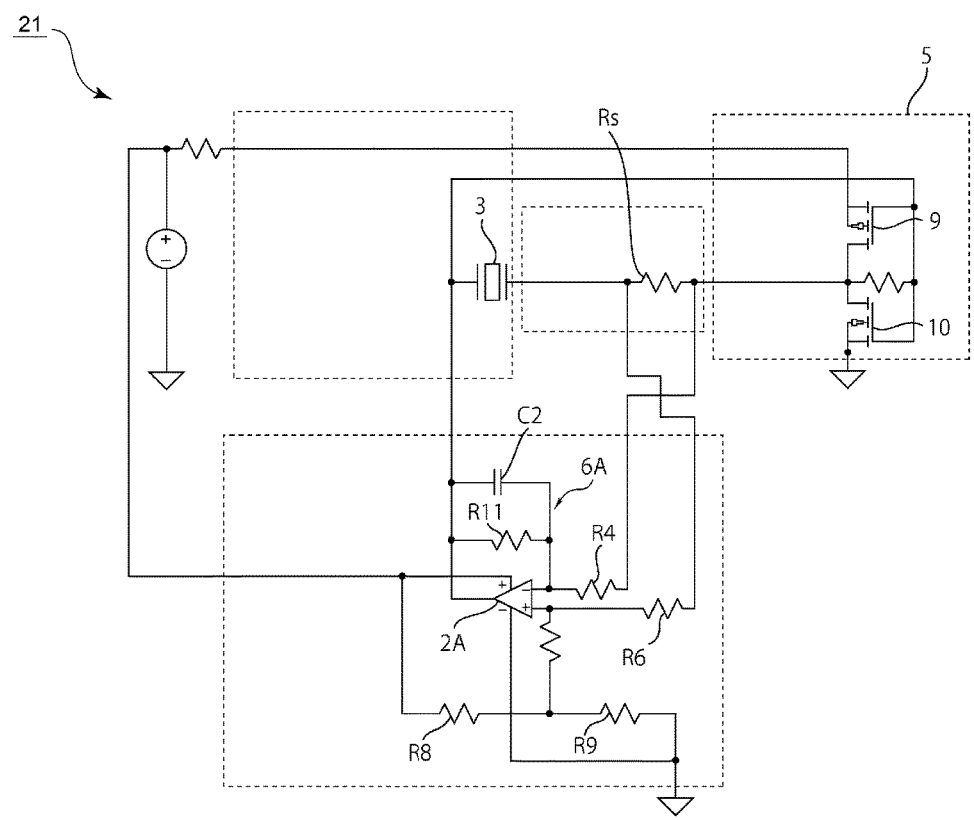
FIG. 8 is a circuit diagram illustrating a specific configuration of an oscillation circuit according to a second embodiment.

FIG. 8 is a diagram illustrating a specific circuit configuration of an oscillation circuit according to a second embodiment. An operational amplifier 2A serves as both the first amplifier 2 and the second amplifier 4, which outputs a substantially square wave, in an oscillation circuit 21 according to the second embodiment. In this manner, an amplifier may double as the first amplifier 2 and the second amplifier 4.

In addition, a low pass filter 6A is connected to the operational amplifier 2A. The low pass filter 6A has a resistor R11 and a capacitance C2 connected in parallel with the resistor R11. In this manner, the circuit configuration of a low pass filter can be variously changed.

Regarding the other points, the oscillation circuit 21 is substantially the same as the oscillation circuit 1 illustrated in FIG. 2. Thus, a description of corresponding portions will be omitted by assigning corresponding references.

Figure 9:
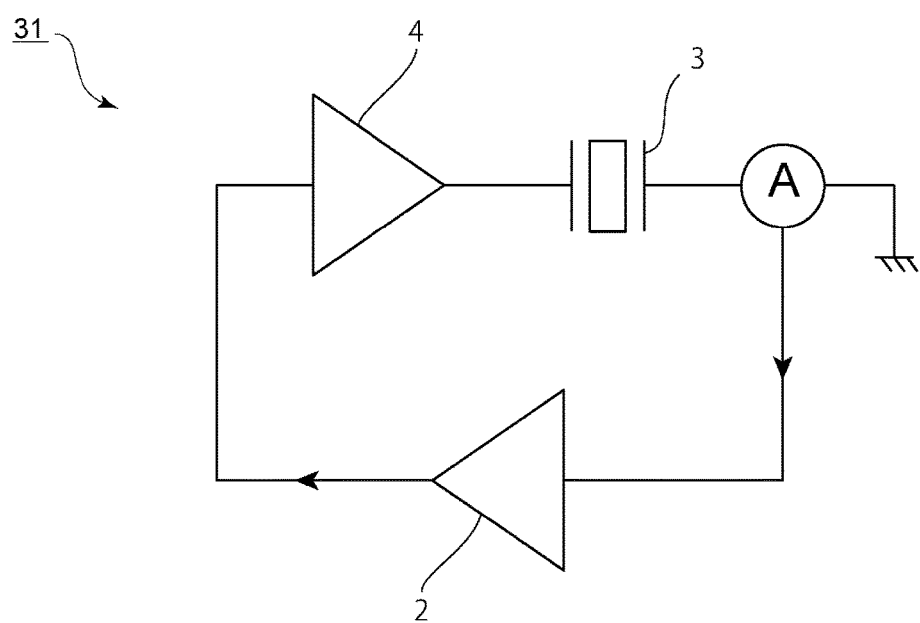
FIG. 9 is a circuit diagram of an oscillation circuit according to a third embodiment.
Figure 10:
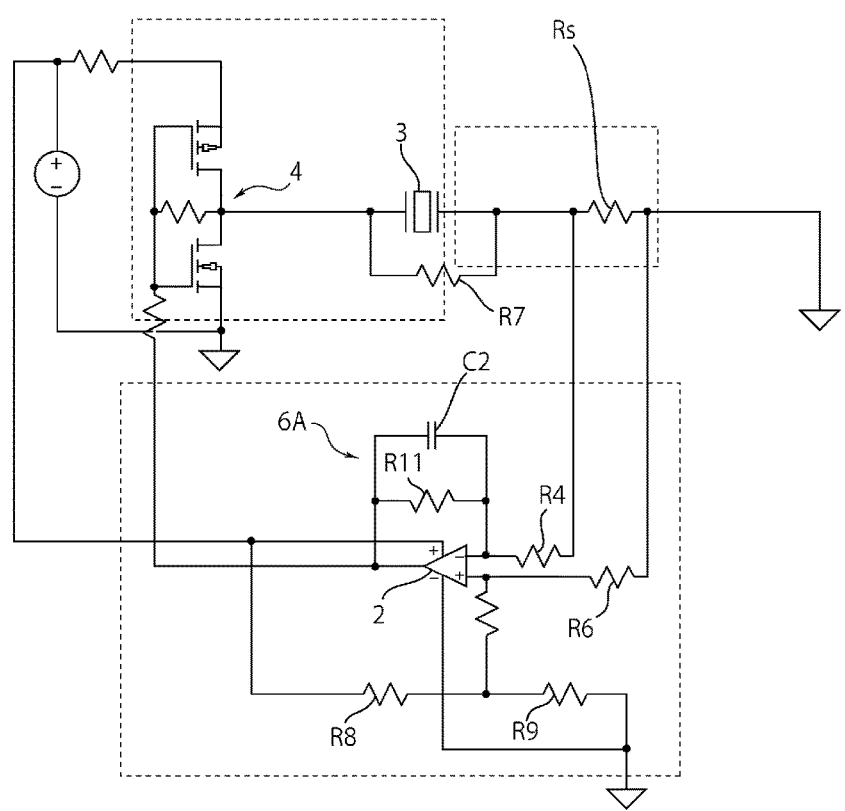
FIG. 10 is a circuit diagram illustrating a more specific circuit example of the oscillation circuit according to the third embodiment.

FIG. 9 is a circuit diagram of an oscillation circuit according to a third embodiment, and FIG. 10 is a circuit diagram illustrating a specific circuit configuration of the oscillation circuit.

The second amplifier 4 is connected between the first amplifier 2 and the input side of the piezoelectric resonator 3 in an oscillation circuit 31 according to the third embodiment. That is, the inverting amplifier 5 for differential driving and used in the first embodiment is not provided. The rest of the configuration of the third oscillation circuit 31 is almost the same as that of the oscillation circuit 1 according to the first embodiment and that of the oscillation circuit 21 according to the second embodiment.

Thus, a description of the same portions will be omitted by assigning the same reference numerals thereto in the specific circuit configuration illustrated in FIG. 10. Note that one end of the piezoelectric resonator 3 is connected to GND with the current measurement unit A interposed therebetween; however, the potential of the connection destination is not limited to GND. It is desirable that setting be performed such that no DC bias is applied to the piezoelectric resonator 3.

The low pass filter 6A substantially the same as that described in the second embodiment is connected to the first amplifier 2, and the low pass filter 6A and the first amplifier 2 are integrated also in the oscillation circuit 31 according to the third embodiment. Thus, the damped-capacitance current $I_{C0}$ and the primary resonance current $I_{1st}$ are temporally isolated from each other before a signal is input to the first amplifier 2 from which a substantially square wave is output, the damped-capacitance current $I_{C0}$ is attenuated by the low pass filter 6A, and the primary resonance current $I_{1st}$ is applied to the second amplifier 4. As a result, a stable oscillation can thus be obtained also in the present embodiment even when the piezoelectric resonator 3 has a small amount of phase rotation, or the amount of phase rotation and those of other piezoelectric resonators 3 are varied.

Similarly to the oscillation circuit 31, a single-output oscillation circuit, which is not a differential-output oscillation circuit, may also be configured.

As described above, the piezoelectric resonator 3 using a piezoelectric ceramic is used in the oscillation circuits 1, 21, and 31 according to the first to third embodiments. Piezoelectric resonators 3 do not have a very high Q factor and the amounts of phase rotation of the piezoelectric resonators 3 are small or varied, and thus even when such a piezoelectric resonator 3 is used, the oscillation frequency can be made to almost match the mechanical resonance frequency. A stable oscillation can thus be obtained.

Figure 11:
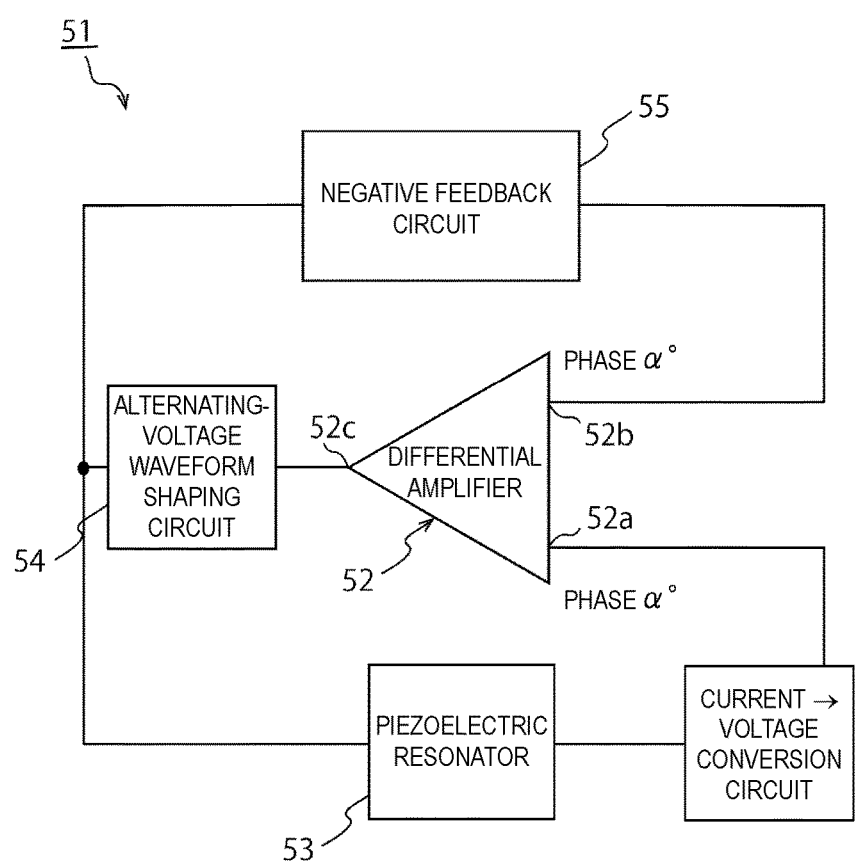
FIG. 11 is a circuit diagram of an oscillation circuit according to a fourth embodiment.
Figure 12:
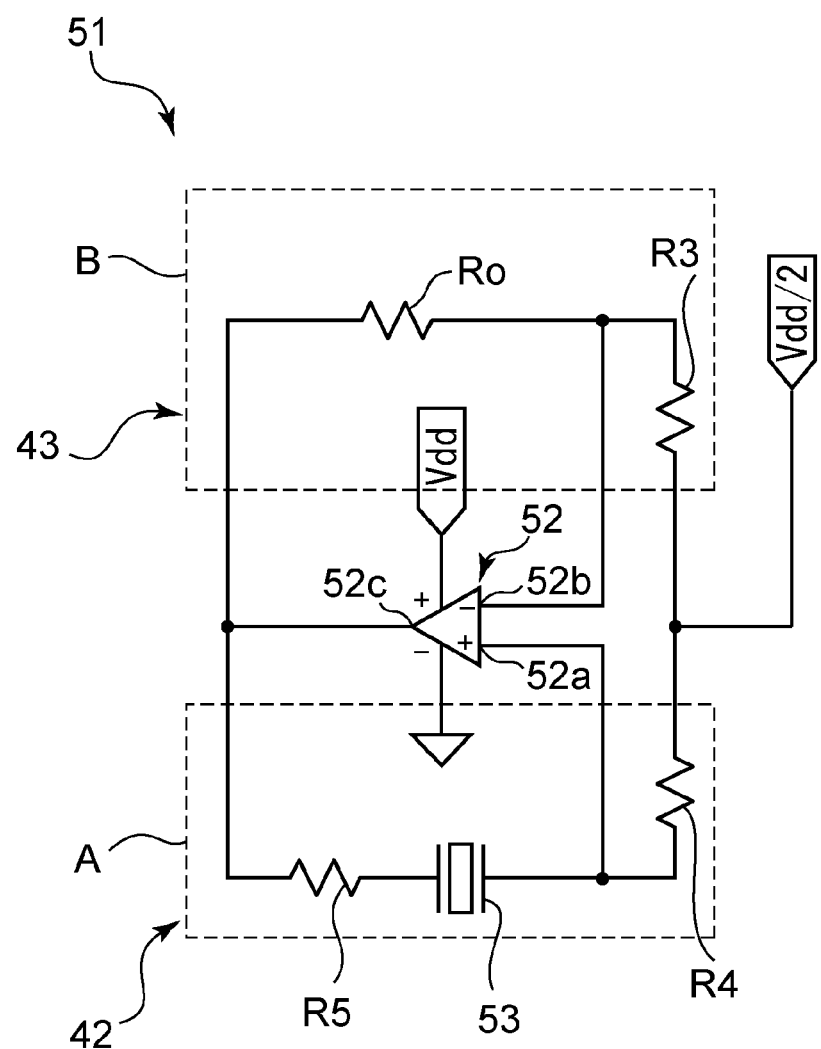
FIG. 12 is a circuit diagram illustrating a more specific configuration of the oscillation circuit according to the fourth embodiment.

FIG. 11 is a circuit diagram of an oscillation circuit according to a fourth embodiment, and FIG. 12 is a circuit diagram illustrating a specific circuit configuration of the oscillation circuit. An oscillation circuit 51 according to the present embodiment is a differential-amplification-type oscillation circuit obtained by applying a Wien bridge oscillation circuit.

The oscillation circuit 51 has a differential amplifier 52 as a first amplifier. The differential amplifier 52 has a first input end 52a, a second input end 52b, and an output end 52c. A piezoelectric resonator 53 is connected between the output end 52c and the first input end 52a. On the other hand, a negative feedback circuit 55 is connected between the output end 52c and the second input end 52b.

The piezoelectric resonator 53 has a configuration as described in Patent Document 1. Although not illustrated, the piezoelectric resonator 53 can have a U-shaped elasticity plate, a piezoelectric element provided at the elasticity plate, and a weight provided at a tip portion of the elasticity plate. As described above, the Q factor is relatively low since the weight is added to the tip of the elasticity plate, or materials for increasing the amount of displacement are selected for the elasticity plate and a piezoelectric ceramic in order to cause vibration at low frequencies. Thus, the piezoelectric resonator 53 has a small amount of phase rotation. In addition, this amount of phase rotation depends on the individual difference and the installation state of the piezoelectric resonator 53.

The oscillation circuit 51 according to the present embodiment is provided with an alternating-voltage waveform shaping circuit 54 that applies an alternating-voltage waveform to the piezoelectric resonator 53. Moreover, the alternating-voltage waveform comprises a voltage waveform having rising portions sharper than those of a sine wave. This will be more specifically described with reference to FIGS. 12 to 14.

FIG. 12 is a circuit diagram illustrating a more specific circuit configuration of the oscillation circuit 51.

A voltage of (½)Vdd is applied as a reference voltage to the oscillation circuit 51. The values of the resistors R3 and R4 are set to 1Ω and 560Ω in the present embodiment.

In the oscillation circuit 51, the resistor R5 is connected in series with the piezoelectric resonator 53 in a first feedback circuit unit A (also shown as circuit 42) that connects the first input end 52a and the output end 52c of the differential amplifier 52. A feedback value of the first feedback circuit unit A can also be adjusted by R5.

On the other hand, a resistor Ro serving as the negative feedback circuit 55 is connected in a second feedback circuit unit B (also shown as circuit 43) that connects the second input end 52b and the output end 52c of the differential amplifier 52.

In the oscillation circuit 51, for example, the current flowing in the piezoelectric resonator 53 is fed back by the resistor R4, which is, for example, 560Ω, and the oscillation frequency is determined by a phase change in this feedback current.

A current feedback value can thus be changed by adjusting the value of the resistor R4. As a result, a loop gain can be determined such that a stable oscillation occurs.

Figure 13:
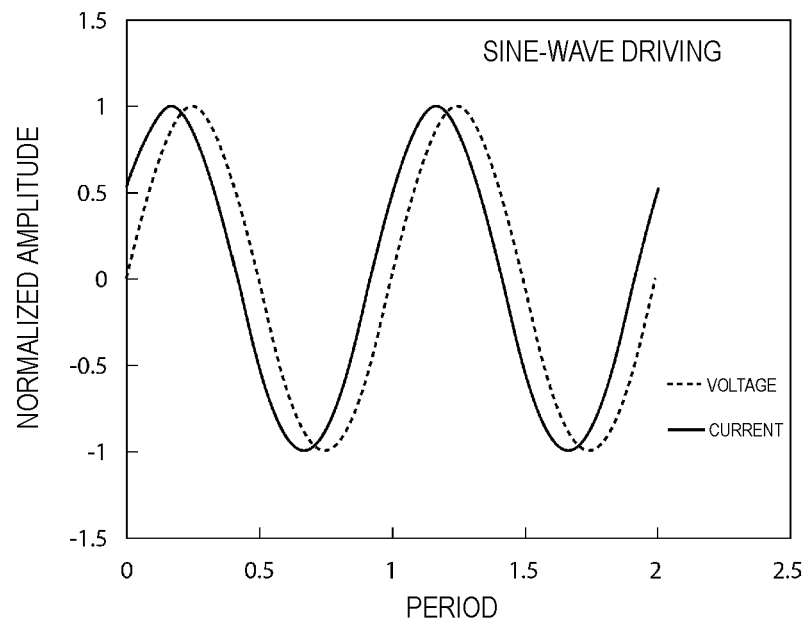
FIG. 13 is a diagram illustrating a voltage waveform and a current waveform in a conventional case where driving is performed using a sine wave.

Incidentally, a waveform similar to that of a sine wave is normally used as an alternating-current waveform to drive the piezoelectric resonator 53 in this type of oscillation circuit. Generally, a piezoelectric resonator exhibits electric characteristics similar to inductive characteristics between the resonance frequency and the anti-resonance frequency, compared with the other frequencies. Thus, the current thus lags behind the voltage. In contrast to this, the piezoelectric resonator exhibits capacitive characteristics in a frequency range other than a range between these frequencies, and the current precedes the voltage as illustrated in FIG. 13. A frequency at which the phase difference between the voltage and the current becomes zero is present between the frequencies for the capacitive characteristics and the frequencies for the inductive characteristics, and the mechanical resonance frequency almost matches the frequency at which the phase difference is zero in a piezoelectric resonator having a high Q factor. Using this characteristic, a piezoelectric resonator in a general oscillation circuit is caused to oscillate near the resonance frequency.

The phases near the resonance frequency lag behind those at the other frequencies also in a piezoelectric resonator having a low Q factor regarding resonance. The amounts of phase rotation near the resonance frequency depend on the Q factor of the piezoelectric resonator. Thus, the difference between a frequency at which the phase becomes zero and the resonance frequency may increase in a resonator having a low Q factor, and in particular, phase rotation may not reach zero in the first place in a resonator having a low Q factor. Thus, when the amounts of phase rotation of piezoelectric resonators are small or varied, it is difficult to cause a piezoelectric resonator to stably oscillate near the resonance frequency in an oscillation circuit using a sine wave.

Figure 14:
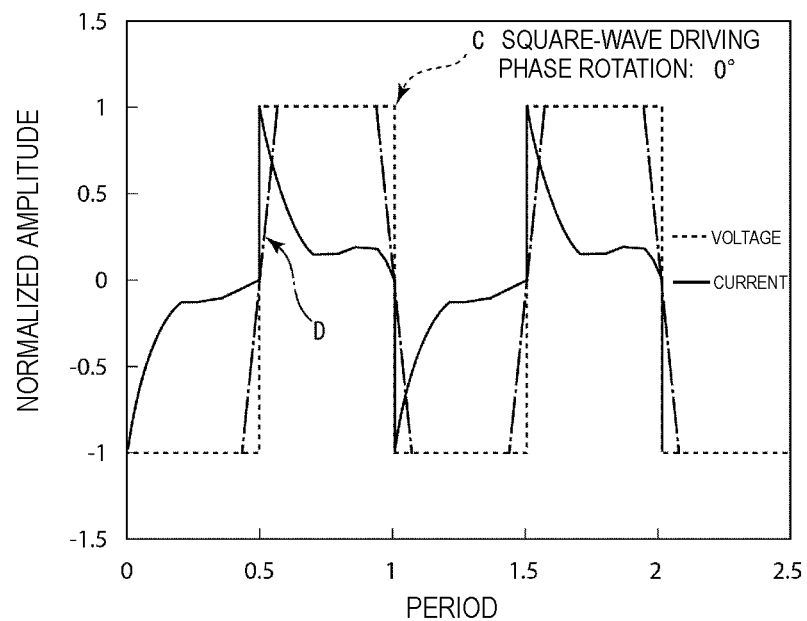
FIG. 14 is a diagram illustrating an alternating-voltage waveform and a current waveform in the fourth embodiment.

In contrast to this, the alternating-voltage waveform shaping circuit 54 schematically illustrated in FIG. 11 is provided in the present embodiment. The alternating-voltage waveform shaping circuit 54 shapes an alternating-voltage waveform C illustrated with a broken line in FIG. 14. As illustrated in FIG. 14, the alternating-voltage waveform C is a substantially square wave. That is, the alternating-voltage waveform C having rising portions sharper than those of a sine wave is used. In this case, since the alternating-voltage waveform rises instantly, the waveform of the damped-capacitance current $I_{co}$ rises almost at the same time and attenuates in a short time. On the other hand, regardless of the amount of phase rotation of the piezoelectric resonator, the primary resonance current $I_{1st}$ flowing in a series resonance circuit has a waveform almost the same as that of a sine wave and is in phase with the voltage waveform at the resonance frequency. In this manner it becomes possible to temporally isolate the damped-capacitance current $I_{co}$ from the primary resonance current $I_{1st}$ flowing in the series resonance circuit. When the primary resonance current $I_{1st}$ for which the amount of phase rotation has the property of becoming zero at the resonance frequency is extracted by this time isolation and the property is used, it is possible to cause the oscillation circuit 51 to stably oscillate irrespective of the amount of phase rotation of the piezoelectric resonator 53 itself. As a result, even when the piezoelectric resonator 53 is used that has a small amount of phase rotation, or the amount of phase rotation and those of other piezoelectric resonators 53 tend to be varied, a stable oscillation can be obtained.

It is noted that the specific configuration of the alternating-voltage waveform shaping circuit 54 is not particularly limited. For example, the amplification factor of the differential amplifier 52 is increased, thereby making the slope of the sine wave sharper. In addition, certain upper and lower voltage portions of the substantially square wave can be shaped by setting, to ±(½)Vdd, voltage waveform portions exceeding ±(½)Vdd. Moreover, the clipping effect of a Zener diode or the like may also be used.

The alternating-voltage waveform acquired in this manner is illustrated with a dot-and-dash line in FIG. 14. The rising portions and falling portions of this alternating-voltage waveform D are slightly less sharp than those of a square wave but sharper than those of a sine wave. Even in this case, since the voltage waveform and the waveform of the damped-capacitance current rise almost at the same time and the waveform of the damped-capacitance current attenuates in a short time, the damped-capacitance current $I_{co}$ can be temporally isolated from the primary resonance current $I_{1st}$ flowing in the series resonance circuit. Thus, also when the alternating-voltage waveform D having rising portions sharper than those of a sine wave is used in this manner, a stable oscillation can be obtained similarly to as in the embodiments above.

Moreover, it is noted that the oscillation circuits described herein are not limited to differential-amplification-type oscillation circuits described above and may also be single-feedback-circuit-type oscillation circuits such as Colpitts oscillation circuits.

Figure 15:
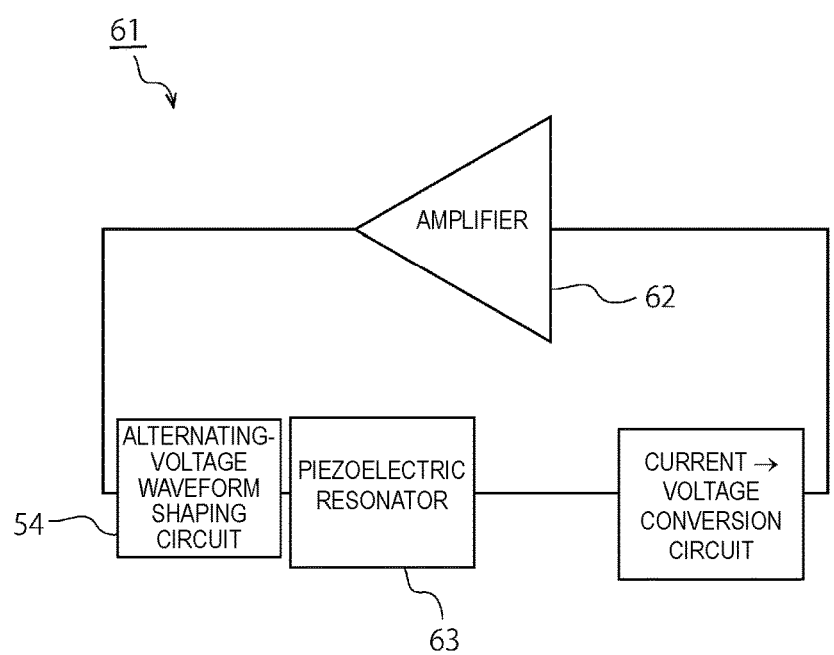
FIG. 15 is a circuit diagram of an oscillation circuit according to a fifth embodiment.

FIG. 15 is a diagram illustrating an oscillation circuit according to a fifth embodiment as a single-feedback-circuit-type oscillation circuit.

An oscillation circuit 61 is a single-feedback-circuit-type oscillation circuit and has an amplifier 62. A piezoelectric resonator 63 is provided in a feedback circuit that connects an input end and an output end of the amplifier 62, and the current flowing in the resonator is used as a feedback amount. Similarly to the piezoelectric resonator 53 described in the fourth embodiment, the piezoelectric resonator 63 has a small amount of phase rotation.

In addition, the alternating-voltage waveform shaping circuit 54 is also provided in the present embodiment. The alternating-voltage waveform shaping circuit 54 applies, to the piezoelectric resonator 63, an alternating-voltage waveform having rising portions sharper than those of a sine wave. This alternating-voltage waveform shaping circuit 54 can be configured as in the fourth embodiment such that the amplification factor is increased or by using various methods.

Since an alternating-voltage waveform sharper than a sine wave is also applied to the piezoelectric resonator 63 and the current flowing in the piezoelectric resonator 63 is also fed back in the present embodiment, a stable oscillation can be obtained even when the piezoelectric resonator 53 has a small amount of phase rotation.

REFERENCE SIGNS LIST 1, 21, 31 oscillation circuit
2, 2A amplifier
3 piezoelectric resonator
4 amplifier
5 inverting amplifier 6, 6A low pass filter
7, 8, 9, 10 FET
42 first feedback circuit unit
43 second feedback circuit unit
51 oscillation circuit
52 differential amplifier
52a first input end
52b second input end
52c output end
53 piezoelectric resonator
54 alternating-voltage waveform shaping circuit unit
55 negative feedback circuit
61 oscillation circuit
62 amplifier
63 piezoelectric resonator
Ro, R1 to R10, R43 to R46 resistor

The invention claimed is:

1. An oscillation circuit comprising:
a first amplifier that has an input end and an output end;
a piezoelectric resonator connected between the input end and the output end of the first amplifier;
an alternating-voltage waveform shaping circuit configured to apply, to the piezoelectric resonator, an alternating-voltage waveform having rising portions sharper than a sine wave; and
a filter configured to attenuate a damped-capacitance current flowing in a damped capacitance in an equivalent circuit of the piezoelectric resonator and allow a resonance current to pass therethrough,
wherein the oscillation circuit is configured to feed, back to the input end of the first amplifier, a current flowing from the output end of the first amplifier to the piezoelectric resonator, and
wherein the alternating-voltage waveform shaping circuit includes a second amplifier connected between the output end of the first amplifier and the piezoelectric resonator and that outputs a substantially square wave to the piezoelectric resonator.

2. The oscillation circuit according to claim 1, wherein the alternating-voltage waveform shaping circuit further comprise an amplifier for differential driving that is connected between the input end of the first amplifier and the piezoelectric resonator and that differentially drives the piezoelectric resonator together with the second amplifier for the excitation.

3. The oscillation circuit according to claim 1, further comprising a series resistor connected in series with the piezoelectric resonator, wherein the current flowing in the piezoelectric resonator is converted into a voltage through a voltage drop across the series resistor.

4. The oscillation circuit according to claim 1, wherein the first amplifier includes an operational amplifier having first and second input ends and an output end, and the filter is connected between one of the first and second input ends and the output end.

5. The oscillation circuit according to claim 4, wherein the filter has an electrostatic capacity and resistors configured as a T-shaped circuit.

6. The oscillation circuit according to claim 3, wherein the series resistor is a temperature compensation resistor with a resistance of that changes with temperature.

7. The oscillation circuit according to claim 1, wherein the filter provides a cutoff frequency that changes with temperature and has a temperature compensation function.

8. The oscillation circuit according to claim 1, wherein an input-voltage threshold of the second amplifier when an input signal rises in the second amplifier differs from input-voltage threshold when the input signal falls in the second amplifier.

9. The oscillation circuit according to claim 1, wherein an input signal range of the first amplifier is a range wider than or equal to an output amplitude range of the second amplifier.

10. The oscillation circuit according to claim 1, wherein the alternating-voltage waveform shaping circuit includes the first amplifier that is provided to output a substantially square wave to the piezoelectric resonator.

11. An oscillation circuit comprising:
a first amplifier that has an input end and an output end;
a piezoelectric resonator connected between the input end and the output end of the first amplifier; and
an alternating-voltage waveform shaping circuit configured to apply, to the piezoelectric resonator, an alternating-voltage waveform having rising portions sharper than a sine wave,
wherein the oscillation circuit is configured to feed, back to the input end of the first amplifier, a current flowing from the output end of the first amplifier to the piezoelectric resonator, and
wherein the oscillation circuit is a differential-amplification-type oscillation circuit and the first amplifier comprises a differential amplifier with the input end being first and second input ends.

12. The oscillation circuit according to claim 11, wherein the first input end is electrically connected to the output end and the second input end is electrically connected to the output end.

13. The oscillation circuit according to claim 12, wherein the piezoelectric resonator is provided in a first feedback circuit that connects the first input end and the output end of the first amplifier.

14. The oscillation circuit according to claim 1, wherein the oscillation circuit is a simple-feedback-type oscillation circuit.

15. The oscillation circuit according to claim 1, wherein the alternating-voltage waveform applied by the alternating-voltage waveform shaping circuit is substantially a square wave.

16. An oscillation circuit comprising:
a first amplifier that has an input and an output;
a piezoelectric resonator connected between the input and the output of the first amplifier; and
an alternating-voltage waveform shaping circuit configured to apply, to the piezoelectric resonator, an alternating-voltage waveform having rising portions sharper than a sine wave, the alternating-voltage waveform shaping circuit including:
a second amplifier connected between the output of the first amplifier and the piezoelectric resonator that outputs a substantially square wave to the piezoelectric resonator, and
an inverting amplifier connected between the input of the first amplifier and the piezoelectric resonator and that differentially drives the piezoelectric resonator together with the second amplifier for the excitation.

17. The oscillation circuit according to claim 16, wherein the oscillation circuit is configured to feed, back to the input end of the first amplifier, a current flowing from the output end of the first amplifier to the piezoelectric resonator.

* * * * *